United States Patent
Ramdani et al.

[11] Patent Number: 5,796,769
[45] Date of Patent: Aug. 18, 1998

[54] RED LIGHT VERTICAL CAVITY SURFACE EMITTING LASER

[75] Inventors: Jamal Ramdani, Gilbert; Michael S. Lebby, Apache Junction; Wenbin Jiang, Phoenix, all of Ariz.

[73] Assignee: Motorola, Inc., Schaumburg, Ill.

[21] Appl. No.: 699,319

[22] Filed: Aug. 19, 1996

[51] Int. Cl.$^6$ .................................................. H01S 3/19
[52] U.S. Cl. ...................................... 372/45; 372/96
[58] Field of Search ................................ 372/45, 96

[56] References Cited

U.S. PATENT DOCUMENTS

| | | | |
|---|---|---|---|
| 5,442,203 | 8/1995 | Adomi et al. | 372/96 |
| 5,557,627 | 9/1996 | Schneider, Jr. et al. | 372/46 |
| 5,675,605 | 10/1997 | Fujii | 372/96 |
| 5,699,375 | 12/1997 | Paoli | 372/50 |

Primary Examiner—James W. Davie
Attorney, Agent, or Firm—Eugene A. Parsons

[57] ABSTRACT

A stack (103) of distributed Bragg reflectors is disposed on the surface (105) of a semiconductor substrate (102). The stack (103) includes a plurality of alternating layers of material having alternating refractive indexes with the stack (103) having a first dopant type. A first cladding region (104) is disposed on the stack (103) with an active area (106) disposed on the first cladding region (104). The active area (106) includes layers of indium aluminum gallium phosphide, indium gallium arsenide phosphide, and indium aluminum gallium phosphide. A second cladding region (107) is disposed on the active area (106) with a stack (108) of distributed Bragg reflectors disposed on cladding region (107). A contact region (109) is disposed on the stack (108).

12 Claims, 1 Drawing Sheet

RED LIGHT VERTICAL CAVITY SURFACE EMITTING LASER

FIELD OF THE INVENTION

This invention relates, in general, to layered optical devices and, in particular, to laser optical devices.

BACKGROUND OF THE INVENTION

At present, conventional edge emitting semiconductor lasers are playing a more significant role in optical communication due to their high operating efficiency and modulation capabilities; however, the conventional edge emitting semiconductor laser has several short comings or problems, thus making edge emitting devices difficult to use in some applications.

Recently, however, there has been an increased interest in a device called vertical cavity surface emitting laser (VCSEL). VCSELs have several potential advantages, such as planar construction, emitting light perpendicular to the surface of the die, and the possibility of fabrication in an array. However, while the VCSELs have several advantages, the VCSELs that operate in the visible wavelength have several disadvantages, such as poor carrier confinement which is exacerbated by elevated temperatures. Because of the poor carrier confinement at elevated temperatures, operation of VCSELs that function in the visible wavelength is all but impossible at elevated temperatures. Additionally, because of these problems, usage of VCSELs in the visible wavelength for high volume has been negatively impacted and is severely limited.

In one conventional approach taken to solve this problem, an active layer is made of a strained indium gallium phosphide (InGaP) where the gallium composition has been dropped from 50 percent to about 40 percent, thereby lowering the bandgap and allowing for better carrier confinement in the quantum wells. However, by using this convention approach, the strain (up to 1 percent) in the InGaP quantum wells imposes severe limits on thickness of the quantum wells. Additionally, because of the severe limits in thickness of the quantum wells, any fluctuation in thickness of the quantum wells due to manufacturing (i.e. tolerances, etc.) have a severe impact on the threshold current of the VCSEL.

It can readily be seen that conventional edge emitting semiconductor lasers and existing conventional VCSELs operating in the visible wavelengths have several disadvantages and problems, thus not enabling their use in high volume manufacturing applications. Therefore, a VCSEL that operates at visible wavelengths and a method for making same that simplifies the fabrication process, reduces cost, and has an improved reliability of the VCSEL would be highly desirable.

It is a purpose of the present invention to provide a new and improved vertical cavity surface emitting laser.

It is another purpose of the present invention to provide a new and improved red light emitting vertical cavity surface emitting laser.

It is still another purpose of the present invention to provide a new and improved vertical cavity surface emitting laser with improved reliability and reduced cost.

SUMMARY OF THE INVENTION

The above problems and others are at least partially solved and the above purposes and others are realized in a red light vertical cavity surface emitting laser (VCSEL) including a first stack of distributed Bragg reflectors including a plurality of alternating layers of material having alternating refractive indexes, a first cladding region disposed on the first stack of distributed Bragg reflectors, an active area disposed on the first cladding region, the active area including a first layer of indium aluminum gallium phosphide, a second layer of indium gallium arsenide phosphide disposed on the first layer of indium aluminum gallium phosphide, and a third layer of indium aluminum gallium phosphide disposed on the second layer of indium gallium arsenide phosphide, a second cladding region disposed on the active area, and a second stack of distributed Bragg reflectors disposed on the second cladding region, the second stack of distributed Bragg reflectors including a plurality of alternating layers of material having alternating refractive indexes.

In the red light VCSEL the first layer and the third layer of indium aluminum gallium phosphide have a first percent aluminum composition and a second percent gallium composition and the first percent aluminum composition ranges from 0 percent to 60 percent and the second percent gallium composition ranges from 0 percent to 60 percent. Further, the second layer of indium gallium arsenide phosphide has a third percent arsenic composition and a forth percent gallium composition and the third percent arsenic composition ranges from 0 percent to 60 percent while the fourth percent gallium composition ranges from 1 percent to 4 percent. More specifically, the third percent arsenic composition is adjusted to provide a lowered bulk band gap corresponding to a selected wavelength of emitted light such as, for example, 670 nanometers, and the fourth percent gallium composition is adjusted to provide a tensile/compressive strain in the second layer to enhance the active gain.

DESCRIPTION OF THE PREFERRED EMBODIMENTS

Figure 1:
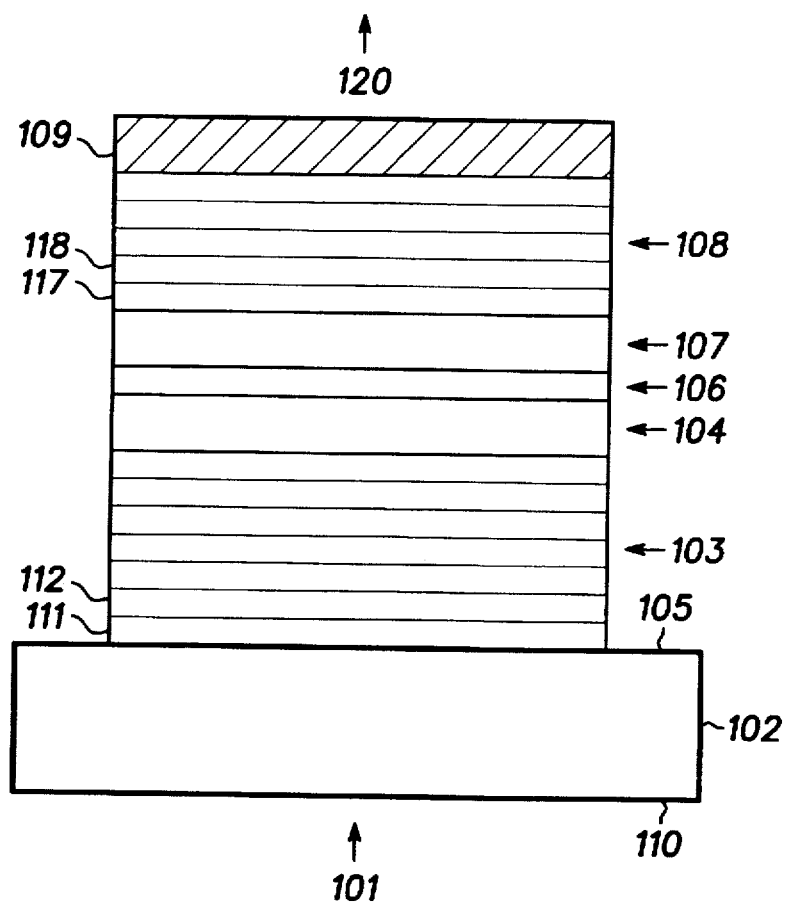
FIG. 1 is an illustration of an enlarged simplified sectional view of a VCSEL device prepared on a substrate.
Figure 2:
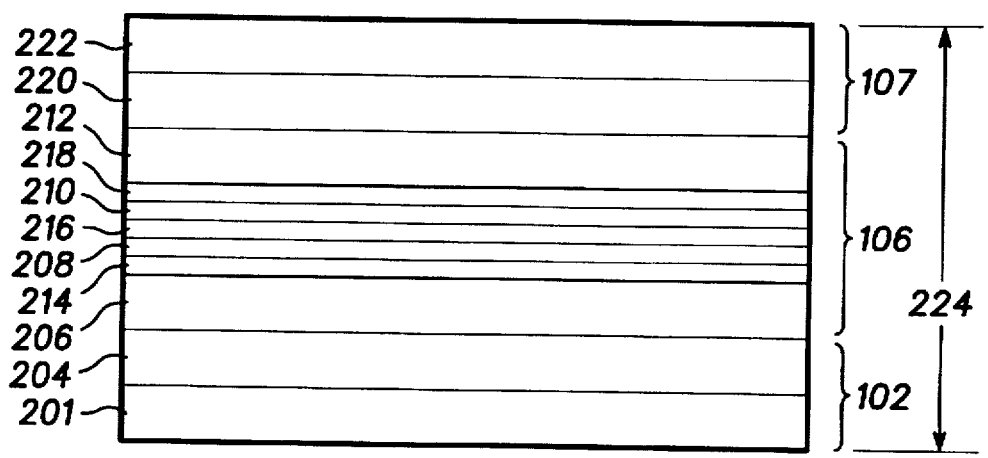
FIG. 2 is a greatly enlarged simplified sectional view of a portion of the VCSEL shown in FIG. 1 illustrating cladding regions and an active region.

Referring now to FIGS. 1 and 2, FIG. 1 illustrates a vertical cavity surface emitting laser 101 formed on a substrate 102 having surfaces 105 and 110 with light, represented by an arrow 120, being emitted from VCSEL 101 and FIG. 2 shows a sectional view of a greatly enlarged portion of VCSEL 101 illustrating cladding regions 104 and 107 with an active area 106 sandwiched therebetween. Generally, as shown in FIGS. 1 and 2, VCSEL 101 is made of several defined areas, such as a stack 103 of distributed Bragg reflectors having a plurality of alternating layers with alternating refractive indexes, illustrated by layers 111 and 112, cladding region 104 having layers 201 and 204, active area 106 having barrier layers 206, 208, 210, and 212 and active layers 214, 216, and 218, cladding region 107 having layers 220 and 222, a stack 108 of distributed Bragg reflectors having a plurality of alternating layers with alternating refractive indexes, illustrated by layers 117 and 118, and a contact region 109. Additionally, a thickness 224 illustrates a sum of the thicknesses of cladding regions 104 and 107 and active area 106.

It should be understood that FIGS. 1 and 2 are simplified illustrations and that many elements have been purposely omitted to more clearly illustrate the present invention. Further, it should be noted that FIGS. 1 and 2 are sectional views and that light emitting device 100 extends into and out of the figure. Thus, light emitting device 100 is used to represent an array of light emitting devices. It should be further understood that VCSEL 101 represents any suitable VCSEL, such as a ridge VCSEL, a planar VCSEL, or the like. Additionally, it should be understood that VCSEL 101 can be formed by any suitable method to shape emitted light (arrow 120) into a variety of geometric patterns, such as a square, a circle, a triangle, or the like.

Substrate 102 is made of any suitable material, such as a semiconductive material, e.g., gallium arsenide, silicon, gallium indium phosphite, or the like. Typically, substrate 102 is made of gallium arsenide so as to facilitate epitaxial growth and lattice matching of subsequent layers that comprise VCSEL 101. Surface 110 of substrate 102 can be used to form a contact (not shown) which is electrically coupled to stack 103 of distributed Bragg reflectors. The contact is typically formed by applying any suitable conductive material, such as a metal, e.g., gold, platinum, silver, an alloy, e.g., germanium gold alloy, or the like to surface 110, or in some applications to surface 105, and annealing the conductive material with substrate 102. However, it should be understood that there are other alternative methods that can be used to electrically couple stack 103 of distributed Bragg reflectors, such as directly coupling to stack 103. The alternative methods can be achieved by combining several processing steps, such as photolithography, etching, and metalization, and the like.

Generally, any suitable epitaxial deposition method, such as molecular beam epitaxy (MBE), metal organic chemical vapor deposition (MOCVD), or the like is used to make the multiple layers such as, stacks 103 and 108 of distributed Bragg reflectors, cladding regions 104 and 107, active area 106, and contact region 109 of VCSEL 101. These methods allow for the epitaxial deposition of material layers, such as indium aluminum gallium phosphide, aluminum arsenide, gallium arsenide, aluminum gallium arsenide, aluminum gallium phosphide, indium aluminum phosphide, and the like.

Stack 103 of distributed Bragg reflectors is epitaxially deposited on surface 105 of substrate 102 with subsequent depositions defining cladding region 104, active area 106, cladding region 107, stack 108 of distributed Bragg reflectors, and contact region 109. Thicknesses of alternating layers 111, 112, 117 and 118 are set as portions of a wavelength of light (arrow 120) that VCSEL 101 is designed to emit. Thus, specific thicknesses of the alternating layers 111, 112, 117, and 118 are a function of the designed wavelength at which VCSEL 101 is designed operate. However, in general, the thickness that is most commonly used is one quarter, one half, three quarters, full wavelength, or any multiples thereof. In a preferred embodiment of the present invention, thicknesses of one quarter wavelength are used for alternating layers of stacks 103 and 108 of distributed Bragg reflectors, illustrated by layers 111, 112, and layers 117 and 118, respectively.

Generally, doping of stacks 103 and 108 of distributed Bragg reflectors is split, with one of the stacks being N-type and the other being P-type. Any suitable N-type dopants, such as silicon, cesium, or the like and P-type dopants, such as carbon, zinc or the like can be use to dope portions of VCSEL 101. Since doping levels are well known in the art, the doping levels will not be describe herein other than to identify material either as undoped, P-type doped, or N-type doped. Briefly, stack 103 of distributed Bragg reflectors and layer 201 of cladding region 104 are N-type doped with stack 108 of distributed Bragg reflectors, layer 222 of cladding region 107, and contact region 109 being P-typed doped. Layers 204 and 220 of cladding regions 104 and 107, respectively, and active area 106 are undoped.

In the present invention, stacks 103 and 108 of distributed Bragg reflectors having alternating layers 111 and 112, 117 and 118 are made of any suitable materials, such as indium aluminum gallium phosphide and aluminum arsenide (e.g., $In_{0.49}Al_xGa_{0.51-x}P/AlAs$), indium aluminum gallium phosphide and indium aluminum phosphide (e.g., $In_{0.49}Al_xGa_{0.51-x}P/In_{0.49}Al_{0.5}P$), and aluminum gallium arsenide and aluminum arsenide (e.g., $Al_{0.5}Ga_{0.5}As/AlAs$), which are epitaxially disposed or deposited on or overlaying substrate 102, thereby generating stacks 103 and 108 of distributed Bragg reflectors. It should be understood that the alternating layers 111 and 112 and the alternating layers 117 and 118 of are formed such that alternating layers 111 and 112 have differing refractive indexes and that alternating layers 117 and 118 also differ in their refractive indexes. However, generally, stacks 103 and 108 of distributed Bragg reflectors are based on the same materials. For example, if stack 103 of distributed Bragg reflectors uses indium aluminum gallium phosphide and indium aluminum phosphide for alternating layers 111 and 112, then the alternating layer 117 and 118 of stack 108 of distributed Bragg reflectors will use indium aluminum gallium phosphide and indium aluminum phosphide. Thus, while the refractive indexes of layers 111 and 112 differ and the refractive indexes of layers 117 and 118 differ, layers 111 and 117 may be made of the same material and layers 112 and 118 may be made of the same materials. Additionally, it should be understood that in each of the above examples where a percent composition of a particular element is given it should be considered only as an example. It should be further understood that variations from these examples can be large and are part of the present invention.

While FIG. 1 illustrates cladding region 104 as a single layer for the sake of simplicity, it should be understood that cladding region 104 as shown in FIG. 2 is made of at least two components that are epitaxially disposed or deposited on stack 103 of distributed Bragg reflectors. First, layer 201, made of any suitable material, such as indium aluminum phosphide (InAlP), indium aluminum gallium phosphide (InAlGaP) or the like, is epitaxially deposited on stack 103 of distributed Bragg reflectors. Layer 201 is made having an appropriate thickness and being doped similarly to stack 103 of distributed Bragg reflectors. Second, layer 204, made of any suitable material, such as indium aluminum gallium phosphide (InAlGaP), or the like having an appropriate thickness and being undoped, is epitaxially deposited on layer 201.

For example, layer 201 of indium aluminum phosphide is epitaxially deposited on stack 103 of distributed Bragg reflectors. Layer 201 is N-doped with any suitable dopant such as silicon, cesium, or the like similar to stack 103. Second, layer 204 of indium aluminum gallium phosphide is epitaxially deposited on layer 201. Layer 204 is undoped. The thickness of layers 201 and 204 is determined by the wavelength of light (arrow 120) that is to be emitted from VCSEL 101, thereby allowing the thickness of layers 201 and 204 to be any appropriate thickness.

Active area 106, as shown in FIG. 1, is represented by a single layer which is epitaxially deposited or disposed on cladding region 104; however, as shown in FIG. 2, active area 106 is more clearly illustrated as including a plurality of layers. More specifically, active area 106 is illustrated as including barrier layers 206, 208, 210, and 212 and quantum well layers 214, 216, and 218. As illustrated, quantum well layers 214, 216, and 218 are interspersed between barrier layers 206, 208, 210, and 212. However, it should be understood that active area 106 can be designed with any number of quantum wells and barrier layers, and can be as simple as a single quantum well layer positioned between two barrier layers.

In the present invention, quantum well layers 214, 216, and 218 are made of undoped indium gallium arsenide phosphide (e.g., $In_{1-x}Ga_xAs_yP_{1-y}$) with barrier layers 206, 208, 210, and 212 being made of undoped indium aluminum gallium phosphide (e.g., $In_{0.5}(Al_{0.5}Ga_{0.5})_{0.5}P$), thereby causing VCSEL 101 to emit light (arrow 120) in the red range of the visible spectrum, as well as allowing VCSEL 101 to operate at elevated temperatures. Percent concentrations of aluminum and gallium that make up the indium aluminum gallium phosphide layer of the barrier layers 206, 208, 210, and 212 can range from 0 to 60 percent, with a preferred range from 10 to 50 percent. In the indium gallium arsenide phosphide of quantum well layers 214, 216, and 218 the percent concentration of arsenic (x) can range from 0 to 60 percent, with a preferred range from 20 to 55 percent; and the percent concentration of gallium (y) can range from 1 to 5 percent, with a preferred range from 2.0 to 4.0 percent, and a nominal value or 2.5 percent.

By adding arsenic to the material making up quantum well layers 214, 216, and 218, a bulk band gap is lowered. For example, with x=52 percent and with y=3 percent, the bulk band gap is lowered to approximately 1.85 electron volts (eV), which corresponds to a wavelength of 670 nanometers. Moreover, in the present example, the bulk band gap discontinuities between the $In_{1-x}Ga_xAs_yP_{1-y}$ quantum well layers and the $In_{0.5}(Al_{0.5}Ga_{0.5})_{0.5}P$ barrier layer is approximately 350 mev or 14 kT, thereby allowing VCSEL 101 to operate with reasonable performances above a room temperature up to 60° C.

Additionally, a compressive strain can be added to quantum well layers 214, 216, and 218 by lowering the gallium concentration ranging from 1.0 percent to 4.0 percent, with a preferred range from 2.0 percent to 3.0 percent, and a nominal value of 2.5 percent. The strain will enhance the active gain, thereby lowering the VCSEL threshold current, which in turn will help in the VCSEL temperature performance.

Operation of VCSEL 101 at 650 nanometers can be achieved by placing quantum well layers 214, 216, and 218 under tensile/compressive strain in a range of approximately ±2% and a preferred strain of 1%, thereby increasing the active bandgap, and lowering the wavelength of emitted light (arrow 120). The tensile strain is achieved by increasing the gallium concentration ranging from 1.0 percent to 4.0 percent, with a preferred range from 2.0 percent to 3.0 percent, and a nominal value of 2.5 percent. The tensile strain will also help enhance the active gain, thus improving the VCSEL performance.

Cladding region 107 is shown in FIG. 1 as a single layer for the sake of simplicity; however, as shown in FIG. 2, cladding region 107 includes at least layers 220 and 222 that are disposed or deposited epitaxially on active area 106. First, layer 220 and 222 are made of any suitable cladding material, with reference to cladding region 104, that is epitaxially deposited to an appropriate thickness.

By way of example, layer 220 is formed of undoped indium aluminum gallium phosphide ($In_{0.49}Al_xGa_{0.51-x}P$) that is epitaxially deposited on active area 106. Generally, the undoped indium aluminum gallium phosphide has a thickness that is determined by the wavelength of light that is to be emitted from the VCSEL 101, thereby allowing the thickness of the aluminum gallium arsenide layer to be any suitable thickness. Subsequently, layer 222 is formed of doped indium aluminum gallium phosphide ($In_{0.49}Al_xGa_{0.51-x}P$) that is epitaxially deposited on undoped layer 220. In accordance with the previous example, doping for layer 222 is with a p-type dopant.

Generally, cladding regions 104 and 107 and active area 106 are combined to provide thickness 224 that is approximately one wavelength of light (arrow 120) emitted from VCSEL 101. However, thickness 224 can be any suitable integer multiple of the wavelength of emitted light. Additionally, it should be understood that thickness are symmetrical, i.e., the thickness of layer 201 is equal to that of layer 222 and the thickness of layer 204 is equal to that of layer 220. Additionally, the thickness of layer 206 equals that of layer 212. In this way, quantum well layer 216 is positioned centrally in the active area 106, with each quantum well layer 214, 216, and 218 being at a standing wave antinode.

Contact region 109 is formed by disposing any suitable conductive material on stack 108 of distributed Bragg reflectors, such as indium tin oxide, gold, platinum, zinc gold alloy, or the like. It should be understood that depending upon which material selection is made the specific method of disposing and patterning of that specific material will change to form contact region 109.

By now it should be appreciated that a novel article and method for making the article have been disclosed. A light emitting device now can operate at elevated temperatures such as 60° C. Additionally, the light emitting device generates light that has the color of red in the visible spectrum, which has been difficult to accomplish in the past. Further, it has been shown that the wavelength of the emitted light can be controlled by changing the stress values of the active layers, i.e., changing the stress values from tensile to compressive. Additionally, since the fabrication of the active layers is integrated in the process flow of the light emitting device, the light emitting device is highly manufacturable, thus reducing overall costs and allowing significant improvements in reliability and quality.

While we have shown and described a specific embodiment of the present invention, further modification and improvement will occur to those skilled in the art. We desire it to be understood, therefore, that this invention is not limited to the particular forms shown and we intend in the appended claims to cover all modification that do not depart from the spirit and scope of this invention.

What is claimed is:

1. A red light vertical cavity surface emitting laser comprising:
 a first stack of distributed Bragg reflectors, the first stack of distributed Bragg reflectors including a plurality of alternating layers of material having alternating refractive indexes with the first stack of distributed Bragg reflectors having a first dopant type;
 a first cladding region disposed on the first stack of distributed Bragg reflectors;
 an active area disposed on the first cladding region, the active area including a first layer of indium aluminum gallium phosphide, a second layer of indium gallium arsenide phosphide disposed on the first layer of indium aluminum gallium phosphide, and a third layer of indium aluminum gallium phosphide disposed on the second layer of indium gallium arsenide phosphide;

a second cladding region disposed on the active area;

a second stack of distributed Bragg reflectors disposed on the second cladding region, the second stack of distributed Bragg reflectors including a plurality of alternating layers of material having alternating refractive indexes with the second stack of distributed Bragg reflectors having a second dopant type; and a contact region disposed on the second stack of distributed Bragg reflectors.

2. A red light vertical cavity surface emitting laser as claimed in claim 1 wherein the first layer and the third layer of indium aluminum gallium phosphide have a first percent aluminum composition and a second percent gallium composition and the first percent aluminum composition ranges from 0 percent to 60 percent and wherein the second percent gallium composition ranges from 0 percent to 60 percent.

3. A red light vertical cavity surface emitting laser as claimed in claim 2 wherein the first percent aluminum composition ranges from 10 percent to 50 percent.

4. A red light vertical cavity surface emitting laser as claimed in claim 1 wherein the second layer of indium gallium arsenide phosphide has a third percent arsenic composition and a forth percent gallium composition and the third percent arsenic composition ranges from 0 percent to 60 percent.

5. A red light vertical cavity surface emitting laser as claimed in claim 4 wherein the third percent arsenic composition ranges from 20 percent to 50 percent.

6. A red light vertical cavity surface emitting laser as claimed in claim 4 wherein the third percent arsenic composition provides a lowered bulk band gap corresponding to a selected wavelength of emitted light.

7. A red light vertical cavity surface emitting laser as claimed in claim 6 wherein the third percent arsenic composition provides a lowered bulk band gap corresponding to approximately a wavelength of 670 nanometers of emitted light.

8. A red light vertical cavity surface emitting laser as claimed in claim 4 wherein the fourth percent gallium composition ranges from 1 percent to 4 percent.

9. A red light vertical cavity surface emitting laser as claimed in claim 8 wherein the fourth percent gallium composition ranges from 2 percent to 3 percent.

10. A red light vertical cavity surface emitting laser as claimed in claim 9 wherein the fourth percent gallium composition is approximately 2.5 percent.

11. A red light vertical cavity surface emitting laser as claimed in claim 4 wherein the fourth percent gallium composition provides a tensile/compressive strain in a range of approximately ±2% in the second layer to enhance active gain.

12. A red light vertical cavity surface emitting laser comprising:

a semiconductive substrate having a first surface and a second surface;

a first stack of distributed Bragg reflectors disposed on the first surface of the semiconductive substrate, the first stack of distributed Bragg reflectors comprising alternating layers of gallium aluminum arsenide and aluminum arsenide with the first stack of distributed Bragg reflectors having a first dopant type and concentration;

a first cladding region disposed on the first stack of distributed Bragg reflectors, the first cladding region including a layer of indium aluminum phosphide;

an active area disposed on the first cladding region, the active area including a layer of indium aluminum gallium phosphide overlaying the first cladding region, a layer of indium gallium arsenide phosphide disposed on the layer of indium aluminum gallium phosphide, and a layer of indium aluminum gallium phosphide disposed on the layer of indium gallium arsenide phosphide;

a second cladding region disposed on the active area; the first cladding region including a layer of indium aluminum phosphide;

a second stack of distributed Bragg reflectors disposed on the second cladding region, the second stack of distributed Bragg reflectors comprising alternating layers of aluminum gallium arsenide and aluminum arsenide with the second stack of distributed Bragg reflectors having a second dopant type and a second dopant concentration; and a contact region disposed on the second stack of distributed Bragg reflectors.

* * * * *